United States Patent [19]

George

[11] 4,006,276
[45] Feb. 1, 1977

[54] MAGNETIC BUBBLE DOMAIN FIELD SHUNT

[75] Inventor: Peter K. George, Placentia, Calif.

[73] Assignee: Rockwell International Corporation, El Segundo, Calif.

[22] Filed: May 12, 1975

[21] Appl. No.: 576,526

Related U.S. Application Data

[63] Continuation of Ser. No. 425,058, Dec. 14, 1973, abandoned.

[52] U.S. Cl. .................... 428/195; 340/174 TF; 428/457; 428/539; 428/900
[51] Int. Cl.[2] ............... G11C 11/14; G11C 19/00
[58] Field of Search ... 340/174 TF, 174 S, 174 BC; 428/457, 900, 539; 427/131, 132

[56] References Cited

OTHER PUBLICATIONS

IBM Tech. Dis. Bull., Keefe et al., vol. 13, No. 11, Apr. 1971, p. 3295.
IBM Tech. Dis. Bul., Geiss et al., vol. 16, No. 5, Oct. 1973, p. 1461.
IBM Tech. Dis. Bull., Keefe et al., vol. 14, No. 9, Feb. 1972, p. 2565.
IBM Tech. Dis. Bull., Almasi et al., vol. 14, No. 9, Feb. 1972, p. 2562.
IBM Tech. Dis. Bull., Ahn et al., vol. 14, No. 6, Nov. 1971, p. 1850.
IBM J. Res. Develop., Chaudari et al., Jan. 1973, pp. 66–68.

Primary Examiner—George F. Lesmes
Assistant Examiner—Stanley S. Silverman
Attorney, Agent, or Firm—H. Fredrick Hamann; G. Donald Weber, Jr.

[57] ABSTRACT

A magnetic bubble domain composite comprising an overlay of highly permeable magnetic material, such as permalloy, is provided for bubble domain material to shunt the magnetic field formed by bubble domains therein into a path that is substantially within the overlay. The overlay shunt reduces the substantial polarization that bubble domains can effect on the poles of field access propagation elements. By reducing the polarization, the shunt avoids drastic increases in the in-plane drive field that would otherwise be necessary to couple bubble domains formed in high magnetization materials to the poles of magnetic propagation elements. For the exemplary permalloy shunt, a typical thickness of approximately 500–1000 Å provides adequate shunting of high magnetization materials, such as GdCo alloys or rare earth garnet alloys, that are capable of supporting small, typically submicron, bubble domains.

6 Claims, 5 Drawing Figures

MAGNETIC BUBBLE DOMAIN FIELD SHUNT

This is a continuation of application Ser. No. 425,058 filed Dec. 14, 1973, now abandoned.

BACKGROUND OF THE INVENTION

1. Field of the Invention

This invention relates to techniques for propagating magnetic single wall (bubble) domains and, more particularly, to field access propagation techniques for high magnetization bubble domain materials.

2. Description of the Prior Art

Typical presently used magnetic rare earth garnet materials provide bubble domains having diameter, at collapse, of about 2–6 microns. To achieve greater efficiency in the use of bubble domains to store and transfer information, bubble domain materials, such as amorphous GdCo and magnetic rare earth garnets, have been developed that can support bubble domains having a relatively small, even submicron, collapse diameter. However, the magnetization of such bubble domain materials is high (on the order of several thousand oersteds) compared to the magnetization (about 200 oersteds) of previous garnet bubble domain materials. As a result, the magnetic field produced by the bubble domains is increased and exerts a correspondingly greater polarizing effect on the poles of propagation elements, such as Y-bars and T-bars.

A high, in-plane drive field is required to overcome the increased polarization of propagation elements and move the bubble domains formed in the high magnetization material. The high drive field requirement makes the design of the associated drive coils and electronics extremely difficult. It may thus be appreciated that it is desirable to have a technique for reducing the polarizing effect of high magnetization bubble domain materials.

SUMMARY OF THE INVENTION

A magnetic bubble domain field shunt comprises a highly permeable magnetic material that is interposed between a magnetic bubble domain material layer and a patterned, propagation-controlling layer. The shunt substantially reduces the polarizing effect of bubble domains on the propagation layer, thereby reducing the drive field necessary for bubble domain propagation. The bubble domain shunt is particularly suited for use with high magnetization bubble domain materials, such as amorphous GdCo, that are used to produce relatively small bubble domains (bubble domains having radii as small as the submicron range).

DETAILED DESCRIPTION

Figure 1:
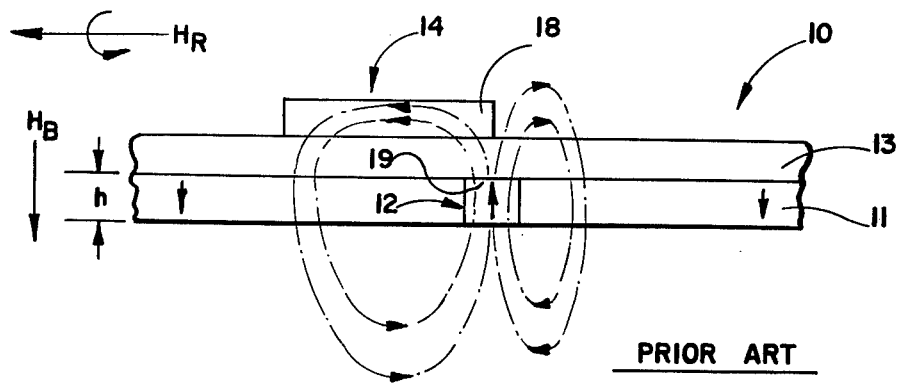
FIG. 1 is a partial, cross-sectional view of a bubble domain composite known in the art showing the polarization of a propagation element by the magnetic field of a bubble domain.

In the description and drawings, similar components bear similar reference numerals.

Referring to FIG. 1, there is shown a partial, cross sectional view of a composite 10 that is known in the art and comprises a layer 11 of bubble domain material, typically a magnetic rare-earth garnet material or amorphous metallic GdCo, that forms bubble domains 12 therein in the presence of a bias field $H_B$. The composite 10 also comprises a non magnetic protective layer 13, typically an electrically insulating material such as $SiO_2$, which is formed on the bubble domain layer 11. A patterned layer of propagation elements, including element 14, is disposed on and supported by the protective layer 13. The propagation element 14 shown in FIG. 1 represents a bar-shaped element formed from highly permeable material such as permalloy. The bar configuration of element 14 is illustrative only, since propagation patterns typically comprise combinations of elements having various shapes.

Figure 2:
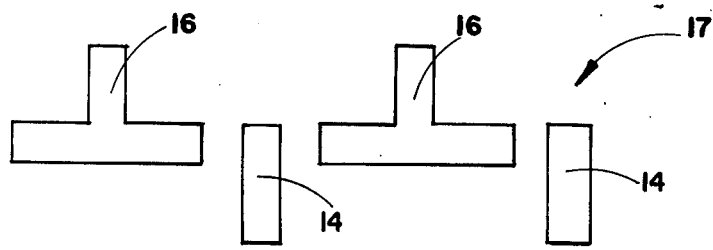
FIG. 2 is a schematic representation of a typical T-bar propagation track that is used in bubble domain devices.

FIG. 2, shows bar- and T-shaped elements 14 and 16, respectively, that are combined to form a T-bar propagation pattern 17. This pattern is typical of many propagation paths and may be used in conjunction with the bubble domain structures shown in FIGS. 1 and 3.

Referring again to FIG. 1, at collapse, the radius of a bubble domain 12 in a thin uniaxial layer 11 of bubble domain material of height $h$ is given by:

$$r_c = \frac{h}{3\left[\left(\frac{4\pi M^2}{\sigma_w}\right)h - \frac{1}{2}\right]},$$

where $M$ is the saturation magnetization of the bubble domain material and $\sigma_w$ is the wall energy. As is apparent, the radius of the bubble domain 12 (assuming fixed wall energy) may be decreased by decreasing the height $h$ and/or increasing the saturation magnetization $M$. However, $h$ must be fixed relative to $r_c$ to provide the maximum stability for the bubble domain 12. Consequently, the only practical way to reduce $r_c$ is to increase $M$. In other words, in order to obtain increased information storage density by reducing the radial size of bubble domains, it is necessary to increase the saturation magnetization of the bubble domain material 11.

Typical previous magnetic garnet bubble domain materials support bubble domains having diameters of about 2–6 microns (hereinafter termed 2–6 micron bubble domains). New bubble domain materials, such as the aforementioned amorphous metallic GdCo material, are capable of forming bubble domains that are as small as one micron, or slightly less than one micron, in radius (hereinafter termed submicron bubble domains).

However, the saturation magnetization of such submicron bubble domain materials is relatively great compared to that of 2–6 micron bubble domain materials. The result of this relatively large magnetization is illustrated schematically in FIG. 1. Assuming a bias field, $H_B$, is applied to the bubble domain layer 11 to form bubble domain(s) 12 and a rotating field, $H_R$, is then applied in the plane of the bubble domain layer, the flux field of the bubble domains polarizes propagation elements such as the bar-shaped element 14. In the illustrative situation shown in FIG. 1, the polarizing effect of the bubble domain field tends to induce a polarity in pole 18 of the element 14 that is opposite to the polarity of nearest pole 19 of the bubble domain 12. Because of the large saturation magnetization of submicron bubble domains relative to 2-6 micron bubbles, the submicron bubbles are more effective in magnetizing propagation elements such as element 14. As a result, the magnetic drive field $H_R$ that is required to overcome the pole 18 and move a submicron bubble domain 12 is increased considerably above the drive field (about 30 oersteds) that is required to move 2-6 micron bubbles.

Currently, 2-6 micron bubbles require $4\pi M$ values of about 150-250 oersteds, while submicron bubbles typically require values that are about 10 times larger, namely 1000-2000 oersteds. Because the field produced by a bubble domain is itself of the order of $4\pi M$, a submicron bubble will then be approximately 10 times as effective as a 2-6 micron bubble in polarizing the elements of a field access propagation pattern. Unfortunately, increasing the separation between the bubble domain layer 11 and the elements of propagation patterns such as the T-bar pattern 17 (FIG. 2), for example, by increasing the thickness of layer 13, is of limited usefulness in decreasing the polarization of the elements. That is, with increasing separation, the discrete nature (spaced opposite poles) of the permalloy pattern as seen by the bubble domains 12 is reduced and the drive field is decreasingly effective in propagating the bubble domains. Thus, the normal approach is to overcome the polarization of the propagation elements by increasing the drive field. However, this approach requires an increase in the drive field that is comparable to the $4\pi M$ (several thousand oersteds for submicron bubble domain materials) of the bubble domain material. Such an increase makes the design of drive coils and associated electronics extremely difficult.

Figure 3:
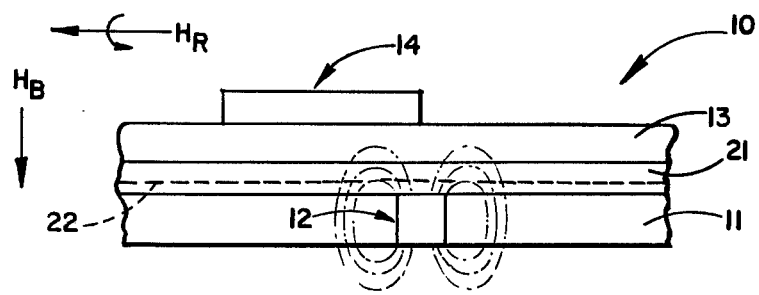
FIG. 3 is a partial, cross-sectional view of a bubble domain composite that includes a field shunt according to the present invention.

Referring now to FIG. 3, in accordance with the present invention, the effectiveness of submicron bubble domains 12 in polarizing magnetic propagation elements, such as element 14, is decreased, and drastic increases in the drive field $H_R$ are made unnecessary by interposing a shunt 21 of highly magnetically permeable material, such as permalloy, between the bubble domain material 11 and the propagation elements. The shunt 21 provides a favorable path for the magnetic field of the bubble domains 12 and reduces the stray field of the bubbles to a fraction of the initial $4\pi M$ value. In effect, the shunt 21 substantially shorts out the flux from the bubble domains 12 and reduces the impact thereof on the propagation path elements.

Referring further to FIG. 3, the bubble domain field shunt 21 may be formed using various techniques that are well known in the art. For example, the shunt 21 may be sputtered onto the bubble domain layer 11. Then, the protective layer 13 and the propagation pattern 17 may be formed on the shunt 21 using vapor deposition and photolithography or other suitable techniques.

The shunt 21 need not be placed directly on the bubble domain layer 11 as shown in FIG. 3. For example, a lower, insulative layer could be grown directly on a bubble domain layer and a shunt could then be interposed between the lower, insulative layer and an upper, insulative layer that supports propagation elements. That is, another layer of insulating material represented by dashed line 22 can be inserted between layers 11 and 21 of the composite structure 10 shown in FIG. 3.

Material other than permalloy may be used for the bubble domain field shunt. For example, it may be desirable to incorporate the bubble domain field shunt into the bubble domain layer by changing the composition of a thin region near the upper surface of the layer. This is particularly true in the case of bubble domain materials such as GdCo, in which case the shunt 21 can be a region of Co formed near the upper surface of the bubble domain layer 11 as part of the fabrication of the bubble domain material layer.

Figure 4:
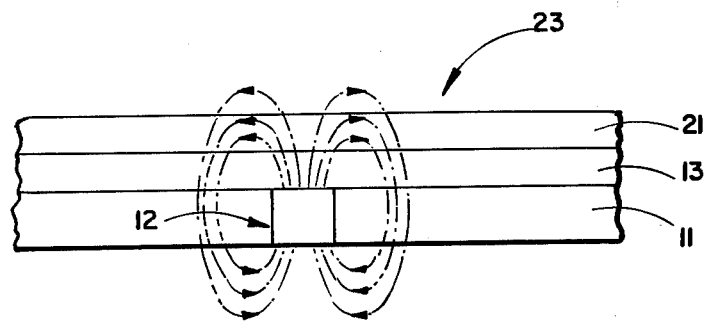
FIG. 4 is a cross-sectional view of an arrangement of a cylindrical bubble domain in a bubble domain composite and a shunt, which arrangement may be used to analyze the bubble domain field shunt of the present invention.

Typically, the shunt path is quite thin. However, the requirements for the bubble domain shunt 21 may be determined by considering a model 23, shown in FIG. 4, of the magnetic bubble domain 12 covered by the protective layer 13 that supports the magnetic shunt layer 21.

Figure 5:
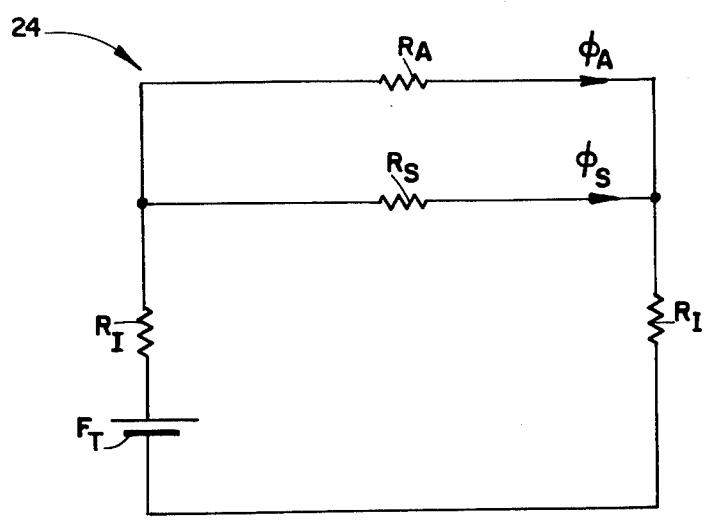
FIG. 5 is the equivalent magnetic circuit for the arrangement shown in FIG. 4.

Essentially, there are two paths for the magnetic flux from the cylindrical bubble 12 to take in returning to the bubble domain layer 11. One path is through the highly permeable shunt 21; the other path is through the surrounding air. An equivalent magnetic circuit 24 for the model bubble domain arrangement 23 is shown in FIG. 5. Assuming that the reluctance, $R_I$, of the protective layer 13 is approximately zero and that the reluctance of the air and shunt paths, respectively, is $R_A$ and $R_S$, the total reluctance, $R_T$, of the combined shunt and air paths will be approximately $$R_T = \frac{R_A R_S}{R_A + R_S}.$$

The combined flux is then given by $$\phi_T = F_T/R_T,$$

where $F_T$ is the total magnetomotive force of the equivalent magnetic circuit 24. The combined flux $\phi_T$ may also be represented as $$\phi_T = \phi_A + \phi_S = \frac{F_T}{R_A} + \frac{F_T}{R_S},$$

where $\phi_A$ is the flux in the air path, and $\phi_S$ is the flux in the shunt path.

If $R_A >> R_S$, then $\phi_S >> \phi_A$ and substantially all the flux follows the path provided by the shunt. Thus, since $R_S$ is proportional to the permeability and the thickness of the shunt 21, the shunt material and/or the thickness thereof may be varied to control $R_S$ relative to $R_A$, and thereby to control the magnetic field of the bubble domain 12 and the polarization of the magnetic propagation elements by the bubble domain field. For submicron bubble domains, a permalloy shunt 21 of thickness of about 500-1000 Å forces substantially all the bubble domain flux within the shunt. Thus, the shunt 21 precludes substantial increases in the drive field that would otherwise be necessary for submicron bubble domains. This is accomplished without adversely affecting the mobility of the bubble domains.

Thus, there has been described a bubble domain field shunt and a bubble domain composite incorporating the shunt that permit the use of high magnetization material suitable for forming small, even submicron, bubble domains without drastic increases in the bubble domain drive fields. Preferred composition, thickness, arrangements and other parameters for the bubble domain field shunt have been described. The scope of the invention is limited, however, only by the claims appended thereto and equivalents thereof.

Having thus described a preferred embodiment of the invention, what is claimed is:

1. A bubble domain composite suitable for propagating magnetic bubble domains therein, comprising:
    a first layer comprising bubble domain material having a high magnetization characteristic for establishing relatively small magnetic bubble domains therein in the presence of a magnetic field which is substantially normal thereto;
    a second layer comprising patterned, high magnetic permeability material supported by said first layer for selectively propagating magnetic bubble domains in said first layer in response to the application of a cyclically varying magnetic field substantially parallel to said first and second layers, said second layer of material subject to a polarizing effect therein due to the magnetic field produced by said magnetic bubble domains;
    a bubble domain field shunt layer comprising a layer of high magnetic permeability material such as permalloy interposed between said first and second layers to decrease the polarizing effect in said second layer caused by the magnetic field produced by magnetic bubble domains in said first layer and thereby decrease the in-plane field necessary to couple magnetic bubble domains to portions of said second layer;
    said shunt layer having a substantially uniform thickness of approximately 500–1000A and extending over a significant portion of the active area of said first layer; and
    a layer of electrically insulating material interposed between said second layer and said shunt layer.

2. A bubble domain composite including a first layer comprising bubble domain material of the class comprising (1) rare earth garnets and (2) amorphous compounds comprising a transition metal and rare earth metal,
    a second layer comprising magnetizable propagation elements supported by said bubble domain layer,
    a shunt layer for reducing the polarizing effect of the magnetic field produced by bubble domains in said first layer on said magnetizable propagation elements,
    said shunt layer comprising a layer of high magnetic permeability material disposed between said first layer and said second layer.

3. The bubble domain composite recited in claim 1 wherein said bubble domain field shunt layer is formed in said first layer by changing the composition of a thin region near one surface of said first layer.

4. The bubble domain composite recited in claim 1 wherein the bubble domain material of said first layer is GdCo.

5. The bubble domain composite recited in claim 4 wherein said shunt layer comprises a region of Co formed near a surface of the said first layer.

6. The bubble domain composite recited in claim 1 including a further layer of electrically insulating material between said first layer and said shunt layer.

* * * * *